United States Patent
Johnson et al.

(10) Patent No.: US 6,960,772 B1
(45) Date of Patent: Nov. 1, 2005

(54) MASK CARRIER

(75) Inventors: Gary J. Johnson, Wappingers Falls, NY (US); David J. Pinckney, Newtown, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,961

(22) Filed: Jun. 9, 2004

(51) Int. Cl.[7] ............................................. H01J 37/00
(52) U.S. Cl. ................................................ 250/442.11
(58) Field of Search ...................... 250/442.11, 441.11, 250/440.11; 134/149, 153

(56) References Cited

U.S. PATENT DOCUMENTS

| | | |
|---|---|---|
| 5,011,867 A | 4/1991 | Mallya et al. |
| 5,232,958 A | 8/1993 | Mallya et al. |
| 5,583,673 A | 12/1996 | Onishi et al. |
| 5,608,555 A | 3/1997 | Onishi et al. |
| 5,620,630 A | 4/1997 | Onishi et al. |
| 6,096,384 A | 8/2000 | Calvert |
| 6,169,039 B1 | 1/2001 | Lin et al. |
| 6,207,555 B1 | 3/2001 | Ross |
| 6,827,092 B1 * | 12/2004 | Smith et al. ................ 134/149 |

* cited by examiner

Primary Examiner—Kiet T. Nguyen
(74) Attorney, Agent, or Firm—Todd M. C. Li

(57) ABSTRACT

A carrier for the masks used in Electron Projection Lithography, or other workpieces used in nanotechnology fields, comprises a rectangular frame having a set of four electrostatic chucks in the top surface for holding the mask above a central aperture that has an electron absorber on the bottom for suppressing backscattering; the frame being supported by a bottom carrier that grips the frame with a set of flexures flexible in the z-direction, stiff in an azimuthal direction and flexible in a radial direction.

20 Claims, 4 Drawing Sheets

MASK CARRIER

BACKGROUND OF INVENTION

The field of the invention is that of electron projection lithography, or other nanotechnology fields, in particular holders for masks or other workpieces used in connection therewith.

Electron Projection Lithography (EPL) is one of the leading candidates for Next Generation Lithography, generally considered to be linewidths of 65 nm and below.

Other candidate technologies are electron pencil beams in a direct write mode and X-ray lithography. In the former the very thin electron beam is focused to the required size beamspot and is focused directly on the wafer. This technology is used currently and has been used for some time in writing masks (more formally termed reticles) for optical lithography. In the latter, the X-ray beam is spread out to the dimension of the chip being exposed and a method similar to contact printing is used. This type of printing is used because X-Rays cannot be focused. Since the mask and final image are in a 1:1 ratio, accuracy requirements in making the mask are extreme.

Electron Projection Lithography has the benefit that the mask is larger than the final image, so that errors in the mask (reticle) are demagnified by the demagnification ratio when they print on the final wafer image. Conventionally, a demagnification ratio of 4:1 is used in electron projection lithography.

In currently preferred technology, the EPL mask is formed in a very thin membrane that is selected with a thickness of less than one micron to reduce the heat load of energy deposited by electrons that are not part of the image. In contrast to a stencil mask that absorbs the unwanted beam, such as is used in photon (optical) lithography, the electron mask scatters the unwanted electrons only slightly, and subsequent optical elements remove the unwanted electrons from the beam.

EPL masks may be formed of any convenient material. Silicon is preferred because it is durable, its properties are well known and semiconductor techniques can be used to form the desired pattern in the material.

An alternative technology, referred to as a stencil mask, employs a mask thickness of one to three microns that absorbs the unwanted electrons.

Both of these competing technologies employ masks that are fragile and are susceptible to distortions even when they do not break. This extreme susceptibility arises in part from dimensional changes or distortions that will be reflected in changes in the final image.

It is essential, therefore that the masks be held in fixtures that do not distort them, both when being handled and also when in use.

Further, it is essential that the masks be clamped in an identical manner during mask formation and in use.

At the present state of development, nominal requirements for a mask holder are:
 maintain<2 micron clamp pad coplanarity;
 provide>1PSI clamping pressure;
 provide<5 micron mask to mask positioning repeatability;
 and accommodate 200 mm diameter masks.

SUMMARY OF INVENTION

The invention relates to a holder for 200 mm diameter masks that holds the masks repeatably with acceptable distortion.

A feature of the invention is that the holder fits within a vertical space of illustratively 13 mm.

Another feature of the invention is that the material is both non-magnetic and slightly conductive.

Another feature of the invention is that the assembly is used both to hold the mask during the writing process and also to hold the mask during transport.

Yet another feature of the invention is that the carrier is separable, with a bottom layer that is removed during a projection exposure.

DETAILED DESCRIPTION

Figure 1:
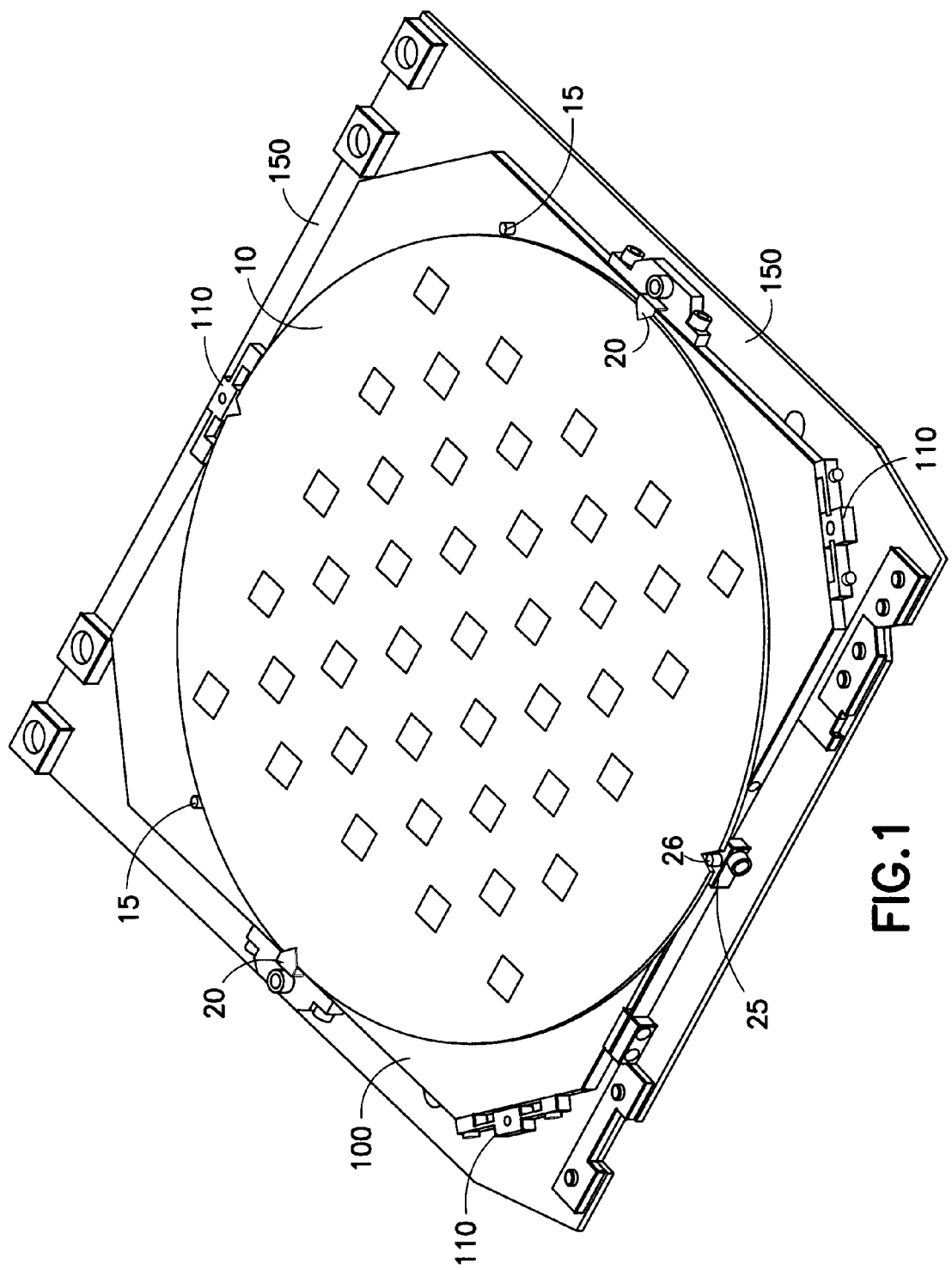
FIG. 1 shows an overall view of the carrier with a mask.

FIG. 1 shows an overall view of the invention holding a mask. Mask 10 rests on a chuck plate 100 that, in turn, rests on a carrier body 150. The mask is held during the exposure process by the electrostatic attraction of a set of electrostatic chucks formed as described below. At other times, mechanical clamps hold the mask with respect to the assembly.

Mask 10 is illustratively formed in a 200 mm diameter silicon wafer. Other mask materials may also be used with the invention.

Mask 10 is positioned with respect to the chuck assembly 100 by a three point system with two reference pins 15 and a flexure assembly 25. The flexure assembly includes a pin 26 that fits into a notch on the mask. Flexure 25 is rigid for motions to the left and right in the figure (which are tangential with respect to the mask) and flexible for motions that are substantially radial with respect to the mask. Flexure 25 is also rigid with respect to vertical motion, but that aspect is not relevant to the mask position because the flexure does not restrict vertical motion of the mask.

For purposes of description, a coordinate system with x and y axes in the plane of the mask and a z axis perpendicular to that plane will be used.

Two clips 20 at three o'clock and nine o'clock on the mask (using the convention that the upper right direction in the figure represents 12 o'clock on the mask face) provide an electrical ground connection to reduce or drain away electrostatic charge and also provide a slight vertical retaining force.

Clips 20 are held in place by retaining screws. The clips are sufficiently flexible that they do not distort the planarity of the mask to any significant degree, so that the amount of torque on the screws is not relevant.

Figure 2:
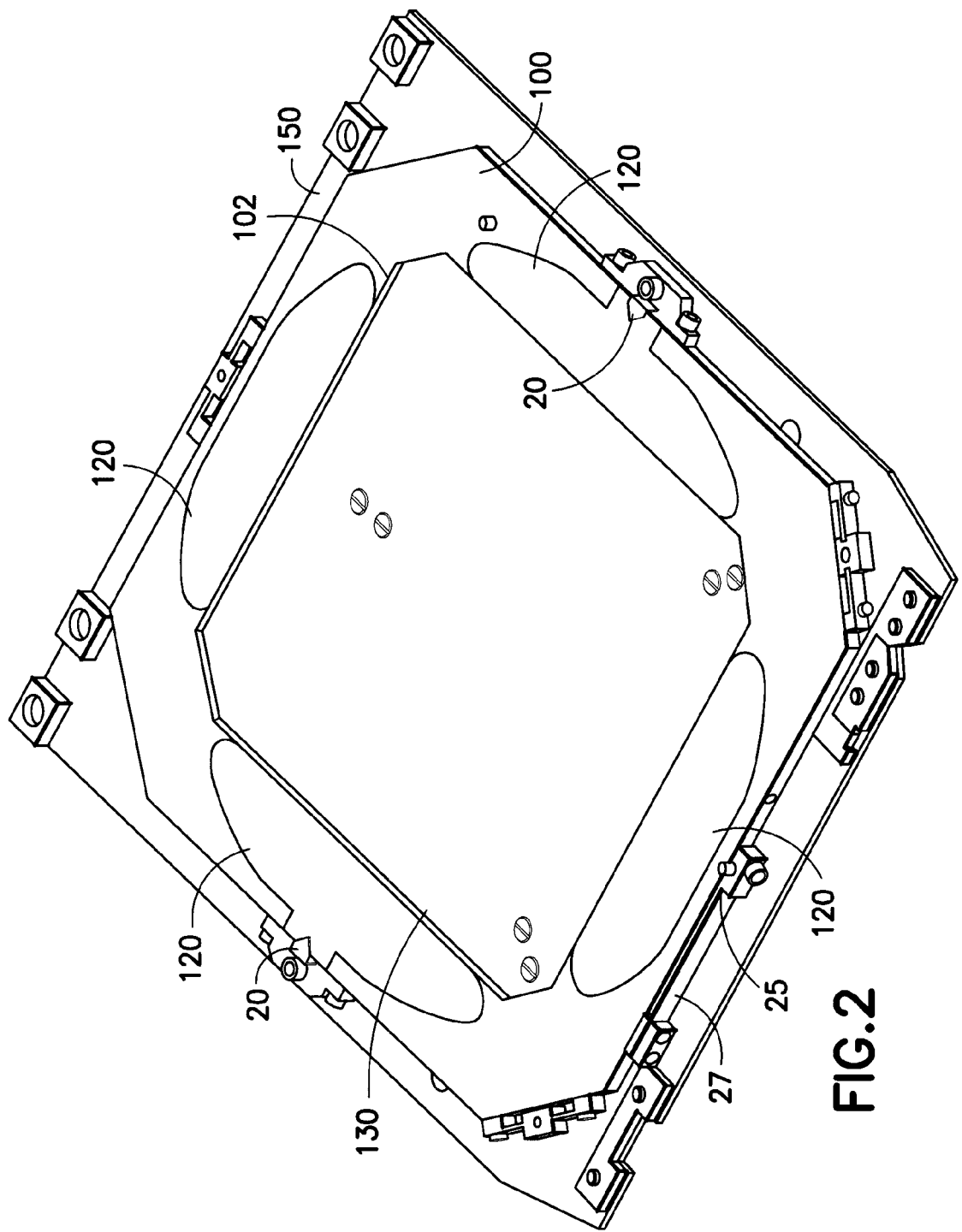
FIG. 2 shows an overall view of the carrier without a mask.

FIG. 2 shows the same chuck assembly with the mask removed. Four electrostatic chucks 120 are visible on the four sides of the central open area (central aperture) of chuck plate 100, denoted with the numeral 102. Chucks 120 may be formed by embedding electrodes below the surface of the chuck plate 100 and depositing an insulator such as another thin layer of alumina over the electrodes; or by any other convenient technique.

Chuck plate 100 illustratively is made from alumina ceramic, which is rigid, non-magnetic and is not a conductor. As discussed below, the frame may be thinly coated with a conductive material, so that it does not support eddy currents during operation of the electron beam writing process, but also drains away stray electrons that will inevitably find their way to the surface of the frame.

One of the requirements on the particular version of the invention illustrated is that the entire assembly, including the wafer, fits in a space 13 mm high. The wafer is 0.7 mm thick, the chuck plate 100 is 6.5 mm thick and the bottom carrier body 150 is 5.8 mm thick.

Those skilled in the art will appreciate that shaping a magnetic field is much more difficult than shaping an optical lens, so that it is important to minimize the space that is outside the path for the magnetic flux. The mask assembly has to fit in such a confined space, so that trade-offs in constructing the machine that writes the masks were made that constrain the space available for the mask and its support.

In the center of aperture 102, the surface of the bottom of the chuck plate is visible. Aperture 102 in this embodiment does not extend through chuck plate 100, but has an aperture depth less than a chuck plate thickness, therefore having a bottom surface. In this case, it is a layer of carbon 130 that absorbs electrons that pass through the mask during the process of mask writing. This absorption is an advantageous feature of the invention, since many other materials will scatter electrons back up toward the mask. When that happens, the image being formed on the mask is distorted by exposure of the resist that is being patterned in the mask writing process.

The carbon 130 is nominally 1 mm thick and the aperture is nominally 5.5 mm deep, leaving a bottom layer thickness of 1 mm for the remaining material of the chuck plate.

Alternatively, the aperture could extend through chuck plate 100 and the carbon would then be on the top surface of carrier body 150. This arrangement would require that the carrier body 150 remains in place during the mask writing process.

On the bottom of carrier body 150, there is another electrostatic chuck. It holds the carrier body 150 in place during the mask writing process, with both chuck 100 and carrier body 150 in position.

Carrier body 150 and electron absorber 130 are removed during the projection lithography exposure. Chuck plate 100 may be used to hold the mask in a projection lithography tool, in which the beam has to pass unhindered along the next section of the tool.

Figure 3:
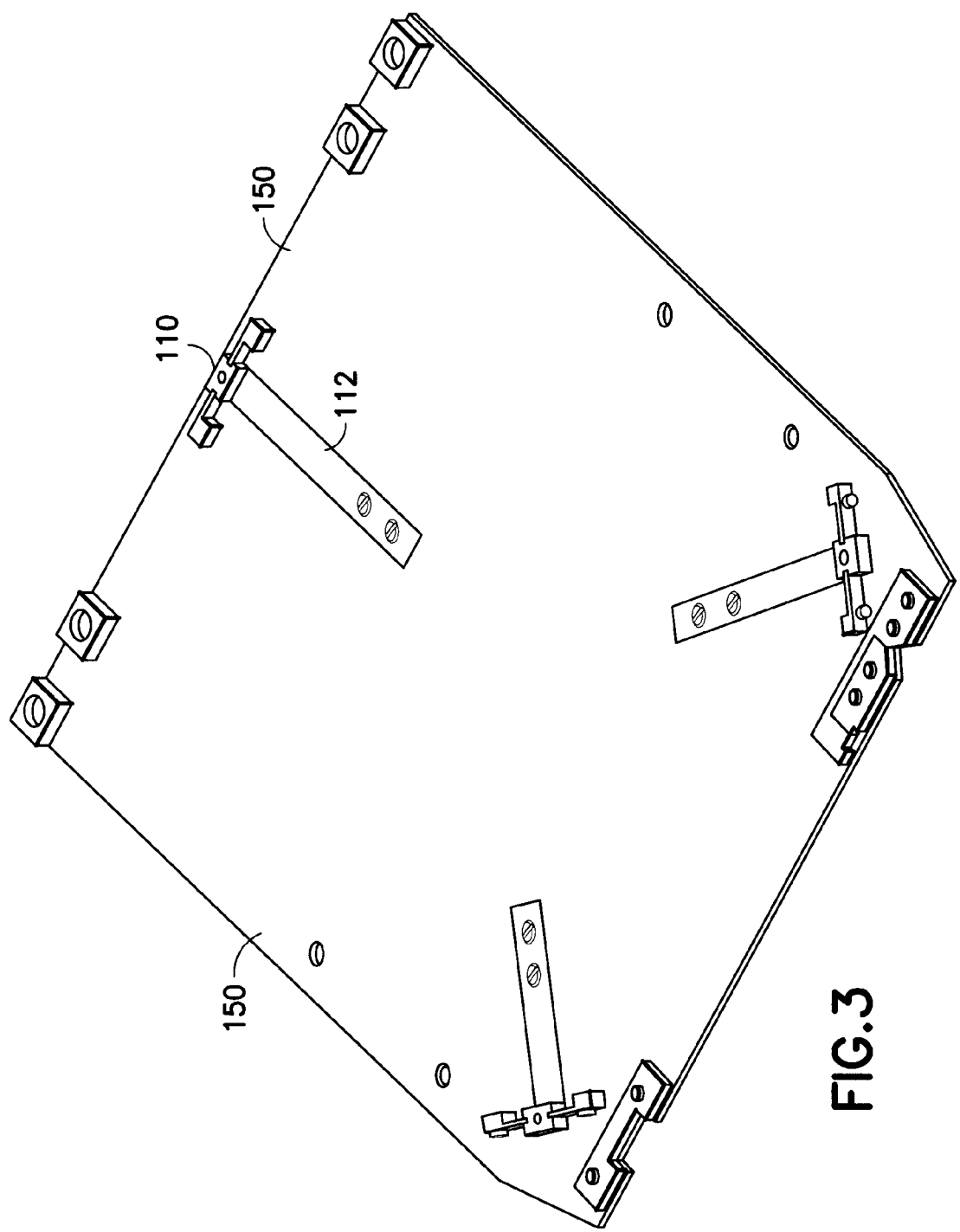
FIG. 3 shows a view of the intermediate layer of the carrier.

FIG. 3 shows the carrier body 150 with the chuck plate 100 removed. Three flexure mounts 110 are positioned at a nominal zero degrees, 120 degrees and 240 degrees about the circumference of the chuck 120. Each flexure mount 110 comprises a thin strip 112, illustratively formed from a strip of BeCu 40–60 mm long, 12 mm wide and 0.25 mm thick. These dimensions give flexibility in the vertical (z) direction together with azimuthal rigidity in the horizontal (x-y) plane.

The mounts are flexible in the radial direction (about the center of chuck 100) to reduce distortion caused by thermal stress (due to differences in material expansion rates) and mechanical stress induced by handling of and electrostatic clamping of carrier body 150 to the mask exposure tool.

Figure 4:
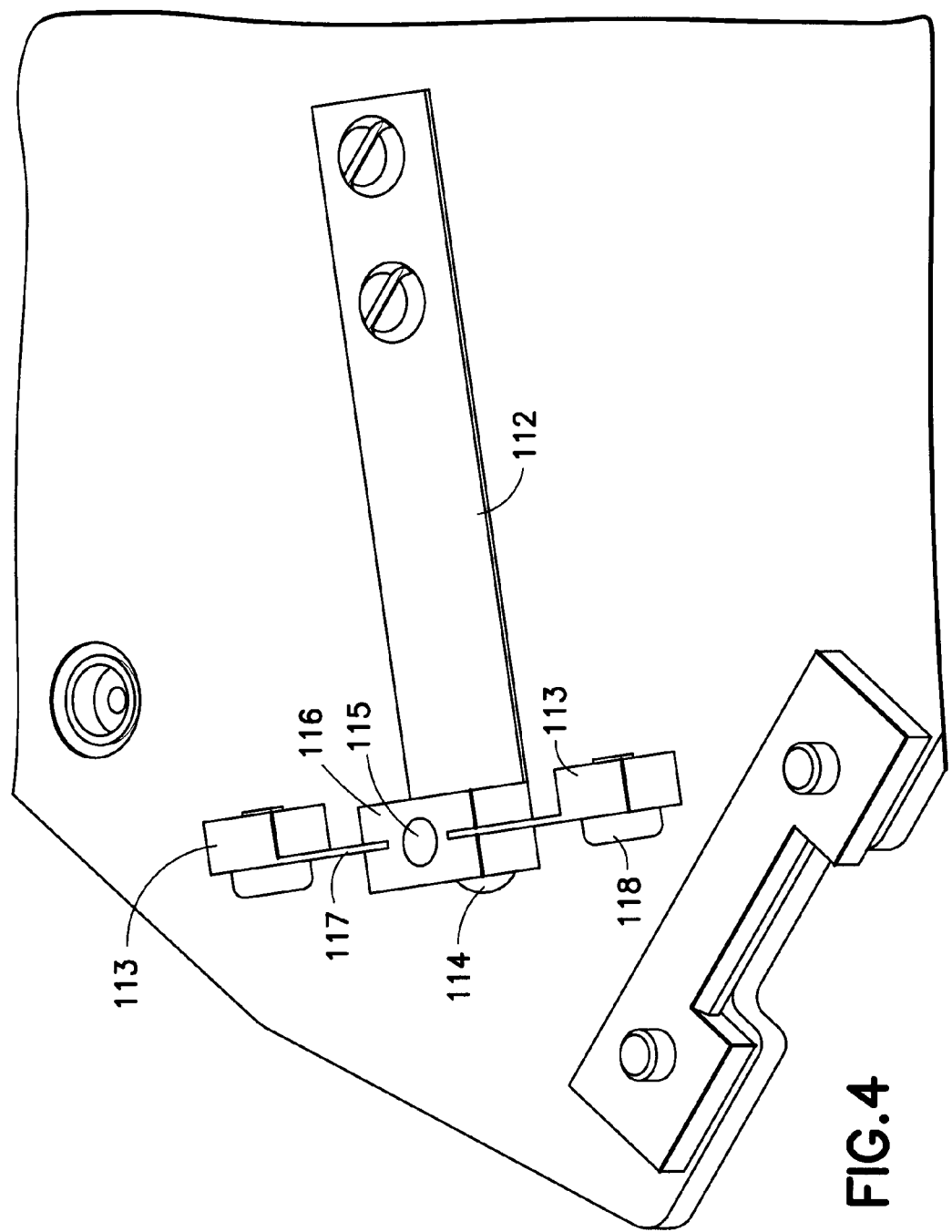
FIG. 4 shows a detail of the flexure mounts.

Details of flexures 110 are shown in FIG. 4, in which two screws mount the strip 112 to the base of carrier body 150. A block 116, illustratively of BeCu is mounted at the outer end of strip 112 and is threaded to hold a z-adjusting screw 115 that adjusts the end vertically over a range of 0.25 mm. The vertical screw 115 rests against bearing pad 114, formed from titanium which is more resistant to particles flaking off it than the low expansion glass ceramic body of carrier body 150. At the sides of the structure, tangent flexures 117 extend outward from block 115 to hold end blocks 113, also of BeCu. These end blocks are provided with clearance holes to accept fastening screws 118 which engage with corresponding threaded holes on the chuck plate 100.

When the structure is assembled, a chuck plate 100 is placed within the set of flexures 110 with screws 118 retracted. Screws 118 are tightened to hold chuck plate 100 in place. Also, vertical screws 115 are adjusted to level the top of chuck plate 100, nominally with a tolerance of less than 2 microns.

The screws and other metal components are made from a non-magnetic material such as BeCu or 6AL-4V titanium. The body of chuck plate 100 is formed from alumina and coated with a conductive ceramic material on regions which would be in the line of sight of stray electrons during use. Carrier body 150 is formed from low expansion glass ceramic and coated with material such as TiN or with Au or Ag, in order to provide a conductive path to drain away stray electrons that would otherwise charge up the material and deflect the electron beam in unpredictable ways.

The sequence of mounting a wafer is:
Assemble the chuck plate 100 to the carrier body 150;
Tighten the horizontal gripping screws 118;
Level the frame of chuck plate 100 in the z-direction;
Place the mask on the top surface of chuck plate 100;
Actuate flexure assembly 25 to simultaneously position the mask against the two reference pins 15 and align the mask notch to pin 26; and
Tighten the ground clips 20 to make contact.

The electrostatic attraction between chuck plate 100 and wafer 10 and between carrier body 150 and the exposure tool is only energized when the chuck assembly is in place in that tool (a mask writing tool or a projection exposure tool).

The mask may be stored in the assembly, and the chuck plate 100 with the mask attached may be removed from the carrier when the mask pattern is to be printed in a projection lithography tool.

Those skilled in the art will appreciate that the structure may be used with a semiconductor wafer instead of a mask in direct-write electron beam lithography. This direct-write may be used in forming integrated circuits or it may also be used in forming components for nanotechnology. For convenience in the claims, the term "workpiece" will be used to denote both a mask, a semiconductor wafer, and a material for nanotechnology components.

While the invention has been described in terms of a single preferred embodiment, those skilled in the art will recognize that the invention can be practiced in various versions within the spirit and scope of the following claims.

What is claimed is:

1. A carrier for holding a workpiece, said workpiece having a central pattern area and an outer area, comprising:
   a chuck plate for holding said workpiece and having at least one clamping area on a top surface thereof;
   a carrier body for supporting said chuck plate;
   a set of gripping members rigidly attached to said carrier body for gripping said chuck plate; and
   a set of alignment members attached to said chuck plate for positioning said workpiece in a reference position relative to said chuck plate.

2. A carrier according to claim 1, in which said chuck plate has a central aperture penetrating to an aperture depth less than a chuck plate thickness, whereby said central aperture has a bottom surface; and said bottom surface has an electron absorber disposed thereon.

3. A carrier according to claim 2, in which said at least one clamping area comprises at least one electrostatic chuck.

4. A carrier according to claim 3, in which a central aperture of said chuck plate is substantially rectangular and said at least one clamping area comprises four electrostatic chucks on four sides of said top surface of said chuck plate.

5. A carrier according to claim 4, further comprising one electrostatic chuck on the bottom surface of said carrier body.

6. A carrier according to claim 2, in which said gripping members for gripping said chuck plate are flexible in a vertical direction perpendicular to said workpiece; stiff in an azimuthal direction about a central point of said chuck plate and flexible in a radial direction with respect to said central point of said chuck plate.

7. A carrier according to claim 1, in which said at least one clamping area comprises at least one electrostatic chuck.

8. A carrier according to claim 7, in which a central aperture of said chuck plate is substantially rectangular and said at least one clamping area comprises four electrostatic chucks on four sides of said top surface of said chuck plate.

9. A carrier according to claim 8, further comprising one electrostatic chuck on a bottom surface of said carrier body.

10. A carrier according to claim 1, in which said gripping members for gripping said chuck plate are flexible in a vertical direction perpendicular to said workpiece; stiff in an azimuthal direction about a central point of said chuck plate and flexible in a radial direction with respect to said central point of said chuck plate.

11. A carrier for holding a mask, said mask having a central pattern area and an outer area, comprising:
   a chuck plate for holding said mask and having at least one clamping area on a top surface thereof;
   a carrier body for supporting said chuck plate;
   a set of gripping members rigidly attached to said carrier base body for gripping said chuck plate; and
   a set of alignment members attached to said chuck plate for positioning said mask in a reference position relative to said chuck plate.

12. A carrier according to claim 11, in which said chuck plate has a central aperture penetrating to an aperture depth less than a chuck plate thickness, whereby said central aperture has a bottom surface; and said bottom surface has an electron absorber disposed thereon.

13. A carrier according to claim 12, in which said at least one clamping area comprises at least one electrostatic chuck.

14. A carrier according to claim 13, in which a central aperture of said chuck plate is substantially rectangular and said at least one clamping area comprises four electrostatic chucks on four sides of said top surface of said chuck plate.

15. A carrier according to claim 14, further comprising one electrostatic chuck on a bottom surface of said carrier body.

16. A carrier according to claim 12, in which said gripping members for gripping said chuck plate are flexible in a vertical direction perpendicular to said mask; stiff in an azimuthal direction about a central point of said chuck plate and flexible in a radial direction with respect to said central point of said chuck plate.

17. A carrier according to claim 11, in which said at least one clamping area comprises at least one electrostatic chuck.

18. A carrier according to claim 17, in which a central aperture of said wafer chuck plate is substantially rectangular and said at least one clamping area comprises four electrostatic chucks on four sides of said top surface of said wafer chuck plate.

19. A carrier according to claim 18, further comprising one electrostatic chuck on a bottom surface of said carrier body.

20. A carrier according to claim 11, in which said gripping members for gripping said chuck plate are flexible in a vertical direction perpendicular to said mask; stiff in an azimuthal direction about a central point of said chuck plate and flexible in a radial direction with respect to said central point of said chuck plate.

* * * * *